US010338820B2

(12) United States Patent
Dimitrov et al.

(10) Patent No.: US 10,338,820 B2
(45) Date of Patent: Jul. 2, 2019

(54) ARCHITECTURE AND ALGORITHMS FOR DATA COMPRESSION

(71) Applicant: NVIDIA Corporation, Santa Clara, CA (US)

(72) Inventors: Rouslan Dimitrov, Santa Clara, CA (US); Jeff Pool, Durham, CA (US); Praveen Krishnamurthy, Apex, NC (US); Chris Amsinck, Cary, NC (US); Karan Mehra, Cary, NC (US); Scott Cutler, San Jose, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 435 days.

(21) Appl. No.: 15/176,082

(22) Filed: Jun. 7, 2016

(65) Prior Publication Data
US 2017/0351429 A1 Dec. 7, 2017

(51) Int. Cl.
H03M 7/00 (2006.01)
G06F 3/06 (2006.01)
H03M 7/30 (2006.01)
G06T 1/20 (2006.01)
H03M 7/40 (2006.01)

(52) U.S. Cl.
CPC ............ *G06F 3/061* (2013.01); *G06F 3/0647* (2013.01); *G06F 3/0661* (2013.01); *G06F 3/0673* (2013.01); *G06T 1/20* (2013.01); *H03M 7/40* (2013.01); *H03M 7/60* (2013.01); *G06F 2212/302* (2013.01)

(58) Field of Classification Search
CPC ...... G06F 3/061; G06F 3/0661; G06F 3/0647; G06F 3/0673; G06F 2212/302; H03M 7/40; H03M 7/60; H03M 7/00; H03M 5/00; G06T 1/20
USPC ................................................ 341/60, 51, 50
See application file for complete search history.

(56) References Cited

U.S. PATENT DOCUMENTS

| 5,394,353 | A | * | 2/1995 | Nusinov | G06F 17/30982 |
| | | | | | 327/212 |
| 7,728,742 | B2 | * | 6/2010 | Gonion | H03M 7/40 |
| | | | | | 341/60 |
| 9,727,459 | B2 | * | 8/2017 | Khoueir | G06F 12/0638 |
| 2009/0138661 | A1 | * | 5/2009 | Lauterbach | G06F 9/30047 |
| | | | | | 711/137 |

* cited by examiner

Primary Examiner — Jean B Jeanglaude
(74) Attorney, Agent, or Firm — Artegis Law Group, LLP

(57) ABSTRACT

A system architecture conserves memory bandwidth by including compression utility to process data transfers from the cache into external memory. The cache decompresses transfers from external memory and transfers full format data to naive clients that lack decompression capability and directly transfers compressed data to savvy clients that include decompression capability. An improved compression algorithm includes software that computes the difference between the current data word and each of a number of prior data words. Software selects the prior data word with the smallest difference as the nearest match and encodes the bit width of the difference to this data word. Software then encodes the difference between the current stride and the closest previous stride. Software combines the stride, bit width, and difference to yield final encoded data word. Software may encode the stride of one data word as a value relative to the stride of a previous data word.

25 Claims, 6 Drawing Sheets

ARCHITECTURE AND ALGORITHMS FOR DATA COMPRESSION

BACKGROUND OF THE INVENTION

Field of the Invention

Embodiments of the present invention relate generally to graphics processing and, more specifically, to architecture and algorithms for data compression.

Description of the Related Art

In computer systems, in general, and in graphics processing units (GPUs), in particular, evolving technology affords manufacturers the ability to produce processors with increasing density that process data with increasing speed and efficiency. Higher data rates associated with streaming video, among other types of data transmission, magnify the importance of conserving memory bandwidth. Accordingly, efforts to reduce the memory bandwidth utilization are increasingly important.

However, present technology has advanced in the areas of processor speed and efficiency at a faster rate than corresponding advances in memory access technology. Consequently, transfers between on-chip processors and external memory may present a bottleneck that limits the overall system speed and efficiency. Additionally, the system may perform an increased number of memory transfers as density of processing increases. Adding more memory circuits corresponding to the increase in memory transfers may improve memory capacity, but adding more memory circuits incurs increased cost and increased use of valuable board area.

A typical GPU includes an on-board level-2 (L2) cache memory that retains data that is frequently accessed or that is made available for immediate processing. The cache is typically limited in capacity, and so the GPU frequently executes transfers to and from a main memory, such as a system memory. System memory resides in integrated circuits that are external to the GPU. As described above, GPUs may consume and generate data at faster speeds than the bandwidth offered by the corresponding memory circuits through which system memory is accessed. One approach to reducing bandwidth usage is to rely on compression techniques to decrease the size of data to be transferred. In contemporary GPUs, though, only data writes from the raster operation unit (ROP) are compressed. ROP traffic accounts for roughly forty percent of the data accesses between the L2 cache and external dynamic random access memory (DRAM).

In sum, present architectures implement compression with only about forty percent of memory transfers, while the remaining memory transfers impose a burden on memory bandwidth usage. Further, as memory transfers are likely to increase with developing processor technology, the memory bandwidth usage may be expected to also increase, resulting in an increase in the bottleneck that further would further limit processing efficiency.

As the foregoing illustrates, what is needed in the art is a more efficient approach to compressing data in memory transfer operations.

SUMMARY OF THE INVENTION

One embodiment of the present invention sets forth a computer-implemented method for a data compression, the method comprising storing a first data word included in a sequence of data words, determining a best stride associated with a next data word in the sequence of data words, compressing the next data based on the difference between the first data and the second data to generate compressed data, and transmitting the compressed data to the memory.

One advantage of the disclosed approach is that including additional compression capability in strategic locations within elements of the GPU results in an architecture that allows compression of an increased percentage of data transfers between L2 and DRAM, thereby conserving DRAM bandwidth, as well as compressing data returning from L2 to these elements of the GPU, saving bandwidth internal to the GPU.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
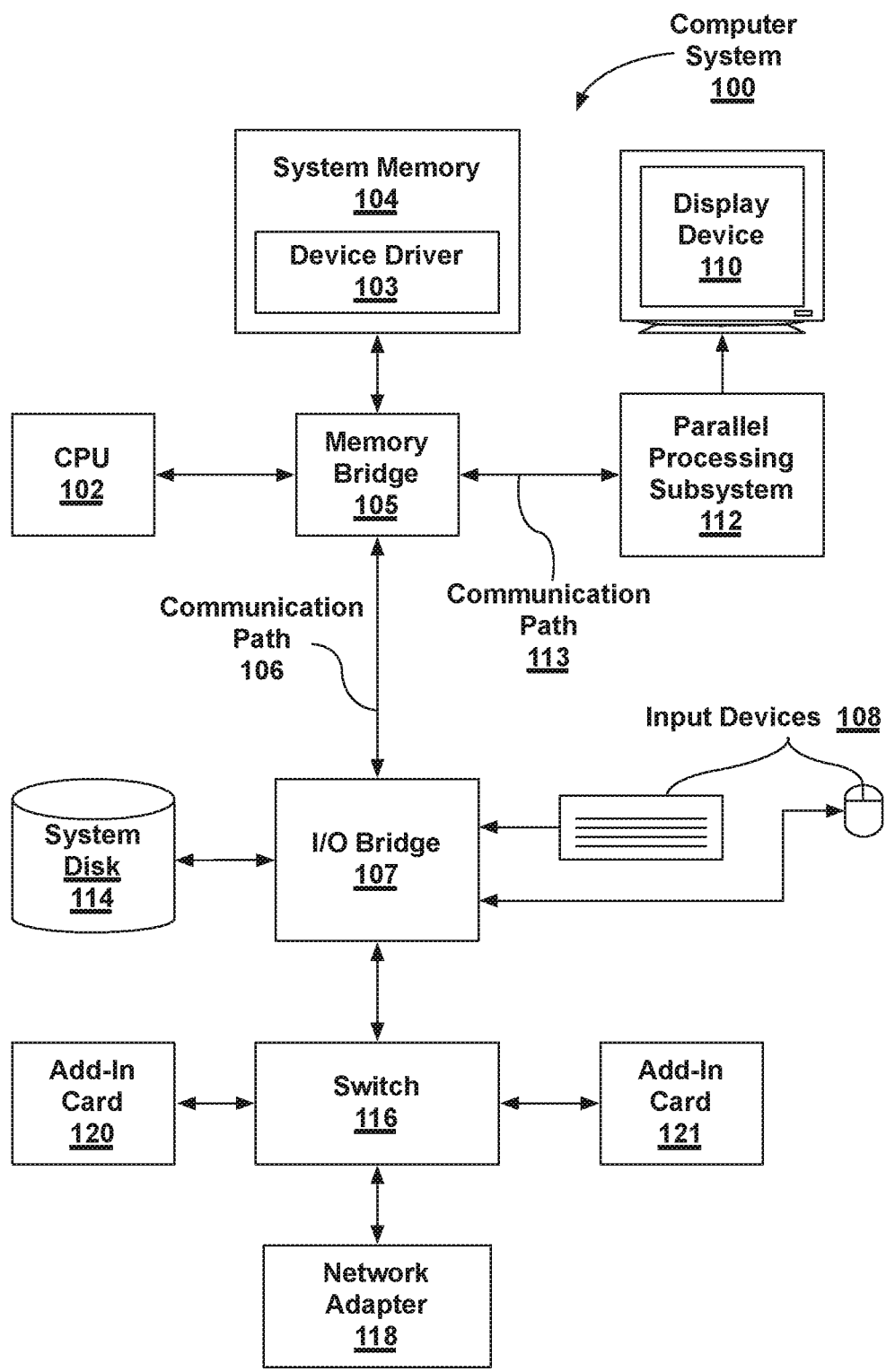
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
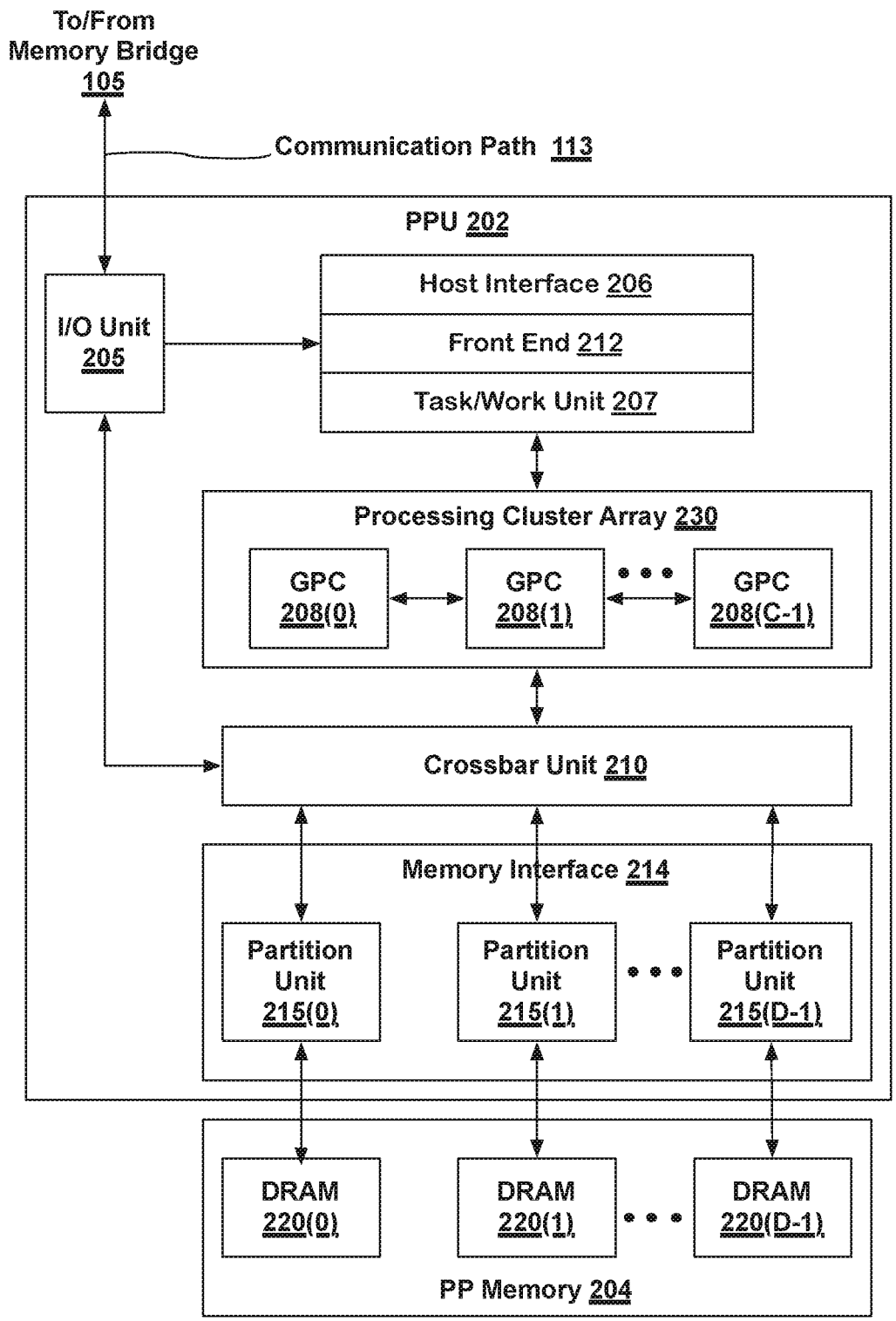
FIG. 2 is a block diagram of a parallel processing unit (PPU) included in the parallel processing subsystem of FIG. 1, according to various embodiments of the present invention.

FIG. 2 is a block diagram of a parallel processing unit (PPU) 202 included in the parallel processing subsystem 112 of FIG. 1, according to various embodiments of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Data Compression Architecture

Figure 3:
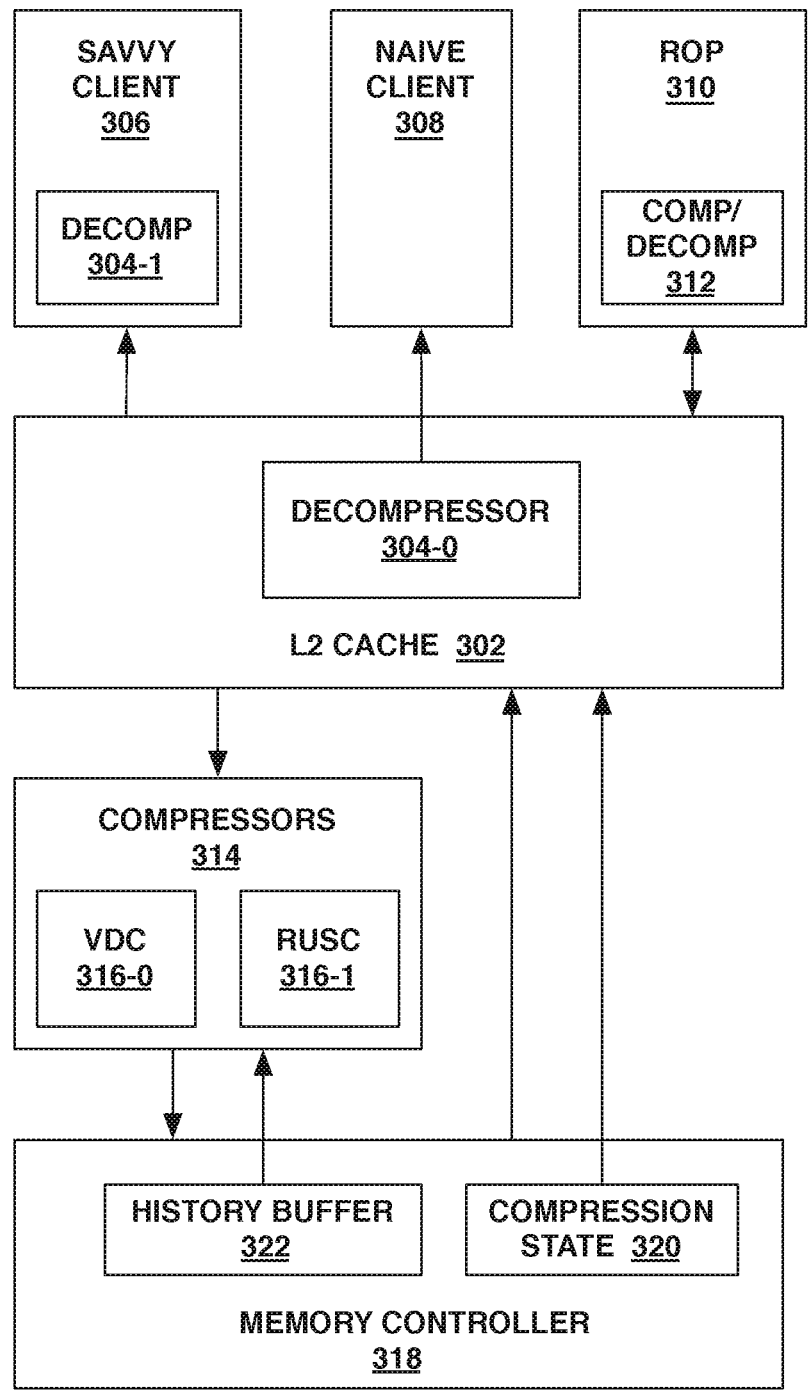
FIG. 3 is a block diagram of compressors and decompressors hardware configured to reduce bandwidth utilization associated with a set of clients, according to various embodiments of the present invention.

FIG. 3 is a block diagram of compressors and decompressors configured to reduce bandwidth utilization associated with a set of clients, according to various embodiments of the present invention. As shown, L2 cache 302 includes decompressor 304-0 and couples to ROP 310, savvy client 306, and naïve client 308. L2 cache 302 further couples to compressors 314 and compression state 320 which resides within memory controller 318. Compressors 314 include variable-width compressor (VDC) 316-0 and recently used sequence compressor (RUSC) 316-1 and couples to memory controller 318 which implements the interface to external DRAM. Compressors 314 could be software modules included in the device driver 103 and executed by the PPU 202 or hardware circuitry that reside in the partition unit 215. Memory controller 318 may also be implemented in software or hardware circuitry or a combination thereof. As also shown, memory controller 318 further includes history buffer 322. In alternative embodiments, history buffer 322 may be included in compressors 314 or any other technically feasible locations.

L2 cache 302 and compressors 314 may be implemented using one or more integrated circuit devices, such as programmable processors, application specific integrated circuits (ASICs), or memory devices, or in any other technically feasible fashion. In some embodiments, task/work unit 207 may include instances of the L2 cache 302 and compressors 314. In other embodiments, instances of the L2 cache 302 and compressors 314 may reside within processing cluster array 230, memory interface 214, or any technically feasible location.

L2 cache 302 is a local data storage utility that is typically limited in capacity. As data storage in L2 cache 302 increases in quantity, GPC 208 flushes the L2 content to memory controller 318 for transfer to DRAM 220 via compressors 314. VDC 316-0 within compressors 314 is a compressor designed for video and images. RUSC 316-1 within compressors 314 is an improved compressor that also compresses data prior to transfer to DRAM and is described in detail below in conjunction with FIG. 4. History buffer 322 couples a sequence of the most recently used data words to compressors 314.

In some embodiments, L2 cache 302 transfers data to compressors 314, and VDC 316-0 and RUSC 316-1 then independently compress the data in parallel. Logic included in compressors 314 then compares the compressed data generated by VDC 316-0 with the compressed data generated by RUSC 316-1 to determine which compressor provides the better compression ratio, The logic included in compressors 314 then selects the compressor for the tile. Generally, VDC 316-0 is particularly appropriate for compressing video and images, although VDC 316-0 may be used to compress any form of data. RUSC 316-1 is particularly appropriate for compressing triangle attributes, such as positions, normal vectors, velocity vectors, and the like, although RUSC 316-1 may also be used for any form of data. Whichever of compressors VDC 316-0 and RUSC 316-1 results in the more efficient compression, that is, the largest compression ratio, is selected per tile and the associated compressed data is then transferred into memory controller 318 for storage in DRAM 220. In other embodiments, any technically feasible criteria may be used to select which compression data to transfer to the memory controller. Persons skilled in the art will recognize that compression ratio is only one example of the criteria that may be considered when selecting which compression data to transfer. Thus, nothing in the foregoing description limits the scope of the present invention.

When memory controller 318 receives compressed data from DRAM 220 for transfer to L2 cache 302, compression state 320 identifies the compression algorithm associated with data transfers. L2 cache 302 thus receives data compressed with a known compression algorithm for transfer to clients that include savvy client 306, naïve client 308, and ROP 310.

Savvy client 306 represents a client that includes inherent decompression capability. Decompression capability may be embedded in various instances of texture units, primitive engines and the like. Thus, an element with embedded decompression capability is an instance of a savvy client.

As shown, savvy client 306 includes decompressor (decamp) 304-1. Thus, when data is retrieved from DRAM, L2 cache 302 may transfer the previously compressed data directly to savvy client 306. When memory controller 318 transfers data targeted for transfer to naïve client 308, L2 cache 302 may execute decompression via decompressor 304-0 and subsequently transfer full format, decompressed data to naïve client 308.

ROP 310 includes native compression and decompression capability. ROP 310 may transfer compressed data into L2 cache 302. Further L2 cache 302 may transfer compressed data into ROP 310. Comp/decamp 312 may implement the RUSC or VDC compressors, for example, to optimize compression and decompression within ROP 310.

The architecture illustrated in FIG. 3 conserves memory bandwidth by transferring compressed data between L2 cache 302 and DRAM 220 via compressors 314 and memory controller 318. Further, the illustrated architecture decreases the total bit content of stored data and thus increases the effective capacity of L2 cache 302. Finally, the illustrated architecture allows for further bandwidth conservation by implementing decompression capacity in previously naïve clients.

Data Compression Algorithms

Figure 4:
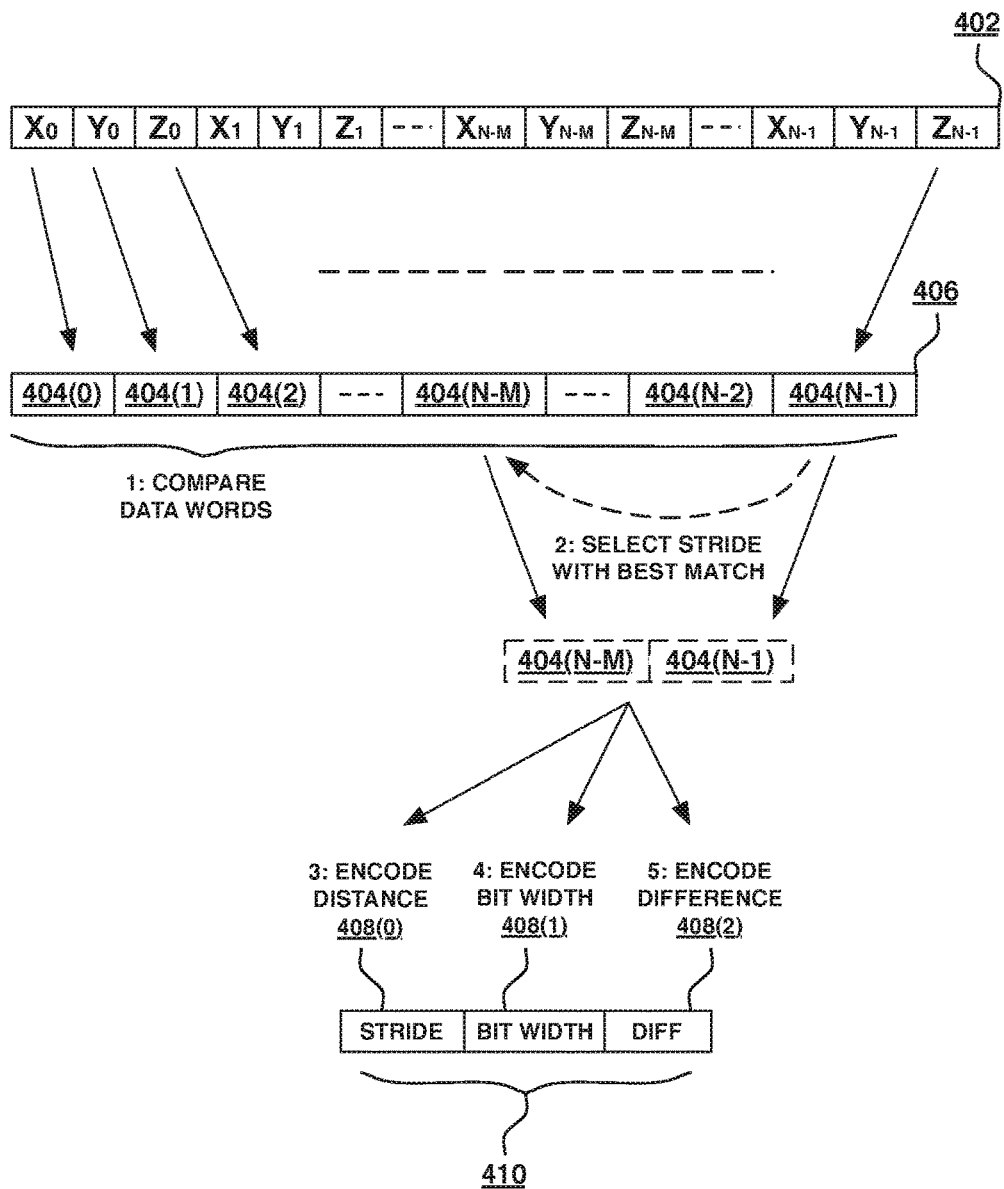
FIG. 4 is a conceptual diagram that illustrates successive steps in a data compression algorithm implemented by the compressors of FIG. 3, according to various embodiments of the present invention.

FIG. 4 is a conceptual diagram that illustrates successive steps in a data compression algorithm implemented by the compressors of FIG. 3, according to various embodiments of the present invention. As shown, example data stream 402 includes sequential sets of primitive coordinates, X, Y, and Z, for a number of primitives to be rendered in a pipeline. In this case, each value is a thirty-two bit data word and are combined to generate a sequence 406 of thirty-two bit data words, 404(0) through 404(N−1), which are stored in history buffer 322. A data word included in sequence 406 is then compressed using compression algorithm RUSC 316-1 to generate compressed data word 410.

In order to compress data word 404(N−1), RUSC 316-1 first compares the value of data word 404(N−1) to the value of each previous data word 404(0) through 404(N−2). The number of previous data words 404 compared in this manner may be adjustable. In a second step, RUSC 316-1 selects the value among the previous data words 404(0) through 404(N−2) that is nearest in value to data word 404(N−1). The number of data words 404 between data word 404(N−1) and the data word 404 with the closest value is the stride at data word 404(N−1). In the example shown in FIG. 4, the value of data word 404(N-M) is illustrated as the nearest match to the value of 404(N−1), so the stride is computed as M−1. In a third step, RUSC 316-1 encodes the distance from the current data word, 404(N−1), to the selected prior data word with the nearest value, 404(N-M), as distance 408(0).

In a fourth step, RUSC 316-1 selects, between the current stride (left over from data word 404(N−2) and the nearest matching stride (distance 408(0)), the stride with the smaller number of bits needed to encode the stride and the difference. If the stride of the previous data word 404 is chosen, it can be encoded with a special flag indicating no change in stride. So, this stage may choose to re-use the previous stride even if the resulting difference is slightly larger than choosing the optimal stride. RUSC 316-1 then encodes the bit width 408(1) of the difference at the selected stride. The bit width may be a maximum of thirty-two bits, however, RUSC 316-1 encodes common bit widths in fewer bits. A bit width of zero is quite common; bit width zero is encoded as 00. Further, a bit width of one is also common; bit width one is encoded as 01. Bit widths between two bits and thirty-two bits are encoded as 1 followed by one-half of the sum of the actual bit width plus one. The encoded resulting bit width is rounded up if the encoding results in a half bit value.

Finally, in a fifth step, RUSC 316-1 determines the difference 408(2) between the current value and the nearest matching prior value. The difference may be computed as an arithmetic difference, an exclusive OR (XOR), or any such perfectly reversible transformation function. Thus, RUSC 316-1 generates a compressed data word 410 that has fewer bits than the full format data word 404(N−1). In one embodiment, compressed data word 410 includes a stride bit that encodes whether the current stride or the nearest matching prior stride is used in the final compressed data word 410.

Figure 5:
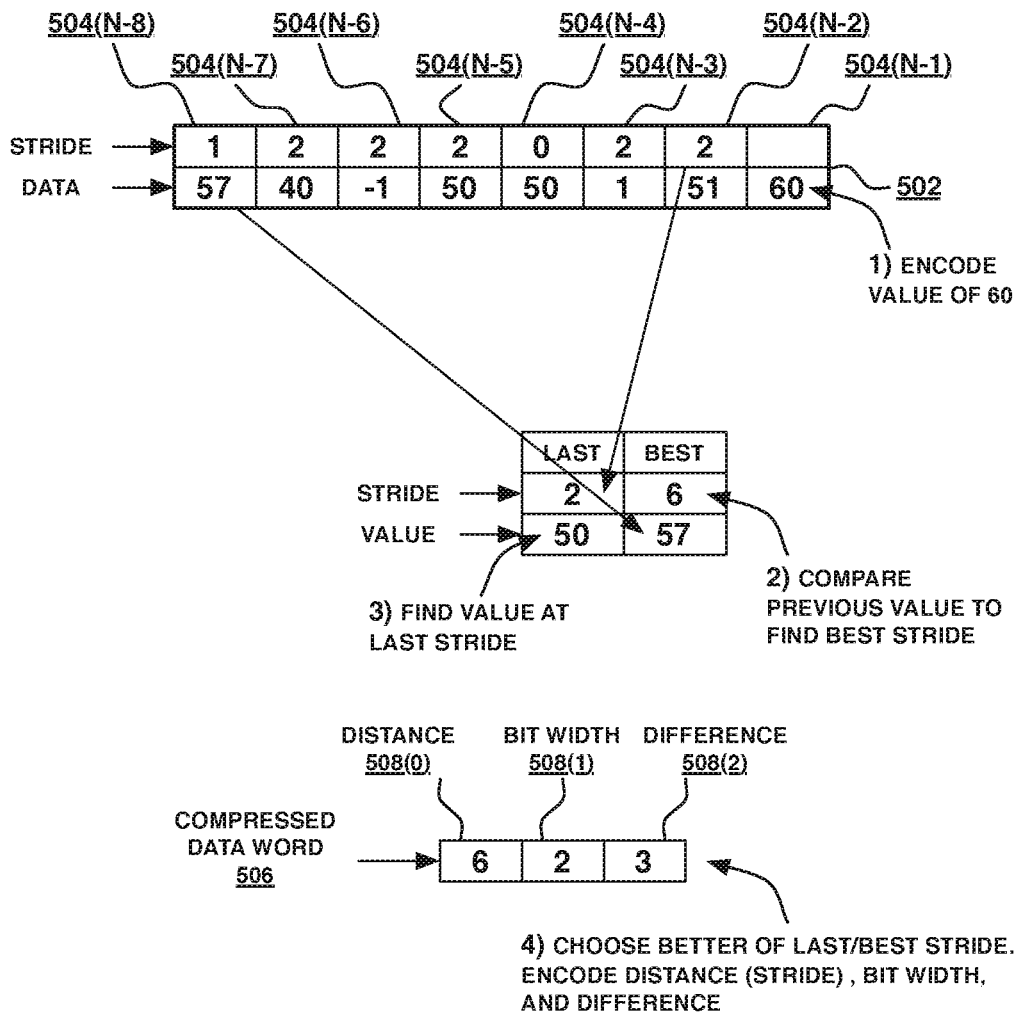
FIG. 5 is a conceptual diagram that illustrates exemplary compression of data performed via the compressors of FIG. 3, according to various embodiments of the present invention.

FIG. 5 is a conceptual diagram that illustrates exemplary compression of data performed via the compressors of FIG. 3, according to various embodiments of the present invention. As shown, data stream 502 includes data words 504(N−1) through 504(N−8). Each data word among data words 504(N−1) through 504(N−8) is derived from a set of primitive coordinates, not shown, as described in conjunction with FIG. 4. A stride is associated with each of data words 504(N−2) through 504(N−8), as they have already been encoded. In a first step, RUSC 316-1 compresses data word 504(N−1) to generate compressed data word 506 by comparing data words 504(N−1) with each of the prior, in this example, seven data words 504(N−2) through 504(N−8).

In a second step RUSC 316-1 selects the stride, among data words 504(N−2) through 504(N−8), that is the nearest in value to data word 504(N−1). Data word 504(N−1) is analogous to data word 404(N−1) described herein in conjunction with FIG. 4. As shown, data word 504(N−8) is the nearest matching previous data word to data word 504(N−1). Data word 504(N−8) is analogous to data word 404(N−M) described herein in conjunction with FIG. 4. In a third step, RUSC 316-1 encodes distance 508(0) as the distance from the current data word to the specific prior data word with the nearest matching stride. Data word 504(N−8) is six data words away from to data word 504(N−1), and, consequently, RUSC 316-1 selects a distance of six as the best matching stride.

In a fourth step, RUSC 316-1 selects the difference with the smallest number of bits, between the current stride (two), 504(N−4) and the nearest matching stride (six), 504(N−8). This stride, six, is encoded in 508(0). RUSC 316-1 then determines the bit width 508(1) of the selected difference.

Finally, in a fifth step, RUSC 316-1 determines first that the difference between data word 504(N−1) and of data word 504(N−8) is three. RUSC 316-1 then encodes a value of three in difference field 508(2), using only the number of bits specified by field 508(1), in this case.

Thus, for the thirty-two bits included in uncompressed data word 504(N−1), RUSC 316-1 encodes nine total bits in compressed data word 506. The stride takes 3 bits (for up to a value of 8), the bit width takes 4 bits, and the difference itself only takes 2. Consequently, RUSC 316-1 achieves a compression ratio for the illustrated example of thirty-two to nine, that is, better than three-to-one.

Figure 6:
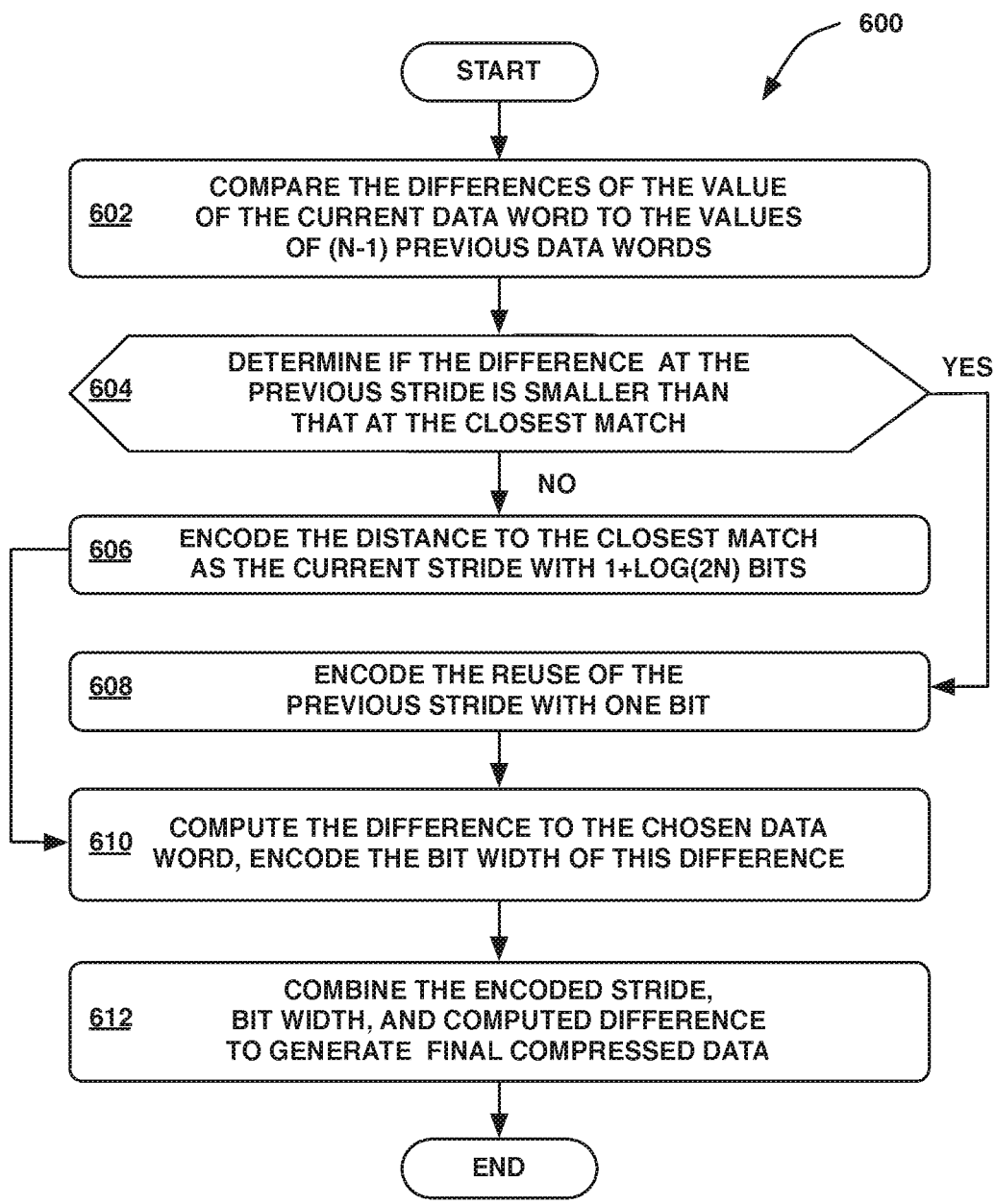
FIG. 6 is a flow diagram of method steps for compressing data, according to various embodiments of the present invention.

FIG. 6 is a flow diagram of method steps for compressing data, according to various embodiments of the present invention. Although the method steps are described in conjunction with the systems of FIGS. 1-5, persons skilled in the art will understand that any system configured to perform the method steps, in any order, is within the scope of the various embodiments.

As shown, a method 600 begins at step 602, where decompressor 304 compares the value of the current data word to the values of a number of prior data words. Specifically, decompressor 304 selects a prior data word among recently used data words that has a value that is the nearest match to the value of the current data word. At step 604, decompressor 304 determines if the difference of the current data word to the selected nearest matching prior value is larger than the difference to the value of the data word at the current stride. If, at step 604, decompressor 304 determines that the difference at the nearest matching prior stride is not larger than the current stride, the method 600 proceeds to step 606. At step 606, decompressor 304 encodes the distance to the closest matching data word. The method then proceeds to step 610.

Returning now to step 604, if, at step 604, decompressor 304 determines that the difference to the value of the data word at the chosen stride is larger than that at the current stride, the method 600 proceeds to step 608. At step 608, decompressor 304 encodes the reuse of the current stride with one bit. The method then proceeds to step 610.

At step 610, decompressor 304 computes a difference field that includes the difference between the current value and the value at the chosen stride. Recall this stride is either a new best stride or the re-used current stride, as determined in step 604. Common differences are encoded in a few bits. For example, a bit width of zero is common. Specifically, for a bit width of 0, the method stores 00. For a bit width of 1, the method stores 01. For any bit width between 2 and 32, inclusive, the method stores 1 followed by the half the sum of actual bit width plus 1. At step 612, decompressor 304 combines the stride, the bit width, and the difference field to yield the final compressed data. By encoding the stride as a relationship to a prior stride, and further encoding the bit width and difference, decompressor 304 generates a final compressed data word that has fewer bits than the original uncompressed data word. The method 600 then ends.

In sum, a system architecture conserves memory bandwidth by including compression utility to process data transfers from the cache into external memory. The cache decompresses data transfers from external memory into the cache and transfers full format data to naive clients that lack decompression capability. Alternatively, the cache directly transfers compressed data to savvy clients that include decompression capability. An improved compressor decreases the total bit content of processed data. Compression software computes the difference between a current data word and each of a number of prior data words. Software selects the prior value with the smallest difference as the nearest match. The distance in memory to this value is considered to be the best stride. The difference to the value at the current stride is considered, and the stride with the smaller difference is chosen as the stride for the current data word. Software then computes the difference between the current value and the value at the chosen stride and encodes the bit width of this difference. Finally, software combines the chosen stride, the bit width, and the difference to yield final encoded current data word.

At least one advantage of the techniques described herein is that the inclusion of compression between L2 cache and external DRAM conserves valuable memory bandwidth. Further, receiving compressed data from DRAM decreases the total bit content of data stored in L2 cache, effectively increasing L2 capacity. Finally, an improved compression algorithm further decreases the total bit content of data transferred between DRAM and L2, stored in L2, and transferred between L2 and internal clients.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable processors or gate arrays.

The flowchart and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While the preceding is directed to embodiments of the present disclosure, other and further embodiments of the disclosure may be devised without departing from the basic scope thereof, and the scope thereof is determined by the claims that follow.

What is claimed is:

1. A computer-implemented method for compressing data, the method comprising:
   storing a first data word included in a sequence of data words;
   determining a best stride associated with a next data word in the sequence of data words;
   compressing the next data word based on the associated stride to generate a compressed data word.

2. The computer-implemented method of claim 1, further comprising:
   determining a first bit width associated with the value located at the current stride;
   determining a second bit width associated with the value located at the associated stride;
   determining a smaller bit width between the first bit width and the second bit width;
   generating a bit width code based on the smaller bit width.

3. The computer-implemented method of claim 2, further comprising determining a difference between the next value and the values at the current stride and at the associated stride.

4. The computer-implemented method of claim 3, wherein determining the difference comprises computing an arithmetic difference between the next value and the values at the current stride and the associated stride.

5. The computer-implemented method of claim 3, wherein determining the difference comprises computing an exclusive OR (XOR) of the next value and the values at the current stride and the associated stride.

6. The computer-implemented method of claim 3, wherein determining the difference comprises computing any reversible function of the next value and the values at the current stride and the associated stride, by which the output of the function and the value at the current stride or associated stride uniquely define the next value.

7. The computer-implemented method of claim 3, wherein compressing the next data word comprises combining the bit width code, the difference, and the stride.

8. A non-transitory computer-readable medium storing instructions that, when executed by a processor, cause the processor to compress data by performing the steps of:
   storing a first data word included in a sequence of data words;
   determining a best stride associated with a next data word in the sequence of data words;
   compressing the next data word based on the associated stride to generate a compressed data word.

9. The non-transitory computer-readable medium of claim 8, further comprising:
   determining a first bit width associated with the value located at the current stride;
   determining a second bit width associated with the value located at the associated stride;
   determining a smaller bit width between the first bit width and the second bit width;
   generating a bit width code based on the smaller bit width.

10. The non-transitory computer-readable medium of claim 9, further comprising:

determining that the number of bits included in the smaller bit width is zero; and generating a bit width code equal to zero.

11. The non-transitory computer-readable medium of claim 9, further comprising:

determining that the number of bits included in the smaller bit width is one; and generating a bit width code equal to one.

12. The non-transitory computer-readable medium of claim 9, further comprising:

determining that the smaller bit width is an even number between two bits and thirty-two bits; and generating a bit width code that includes a binary number that is equal to half the even number plus one.

13. The non-transitory computer-readable medium of claim 9, further comprising:

determining that the number of bits included in the smaller bit width is an odd number between two bits and thirty-two bits; and generating a bit width code that includes a binary number that is equal to half the odd number plus one-half.

14. The non-transitory computer-readable medium of claim 9, further comprising determining a difference between the next value and the values at the current stride and the associated stride.

15. The non-transitory computer-readable medium of claim 14, wherein determining the difference comprises computing an arithmetic difference between the next value and the values at the current stride and the associated stride.

16. The non-transitory computer-readable medium of claim 14, wherein determining the difference comprises computing an exclusive OR (XOR) of the next value and the values at the current stride and the associated stride.

17. The non-transitory computer-readable medium of claim 14, wherein determining the difference comprises computing any reversible function of the next value and the values at the current stride and the associated stride, by which the output of the function and the value at the current stride or associated stride uniquely define the next value.

18. The non-transitory computer-readable medium of claim 14, wherein compressing the first data word comprises combining the bit width code, the difference, and the stride.

19. A system comprising:

a cache memory; and a compressor that resides downstream of the cache memory and is coupled to a history buffer that includes a sequence of data words, wherein the compressor is configured to:

store a first data word included in the sequence of data words;

determine a best stride associated with a next data word in the sequence of data words; and compress the next data word based on the associated stride to generate a compressed data word.

20. The system of claim 19 wherein the compressor is further configured to:

determine a first bit width associated with the value located at the current stride;

determine a second bit width associated with the value located at the associated stride;

determine a smaller bit width between the first bit width and the second bit width; and generate a bit width code based on the smaller bit width.

21. The system of claim 19 wherein the compressor is further configured to determine a difference between the next value and the values at the current stride and the associated stride;

compute any reversible function of the next value and the values at the current stride and the associated stride, by which the output of the function and the value at the current stride or associated stride uniquely define the next value; and combine the bit width code, the difference, and the stride.

22. The system of claim 19 wherein the sequence of data words comprises a selectable number of data words that have been processed.

23. The system of claim 19 further comprising a second compressor that also resides downstream of the cache memory, wherein the second compressor is configured to compress the next data word to generate a second compressed data word.

24. The system of claim 23, wherein either the first compressed data word or the second compressed data word is selected based on the compression ratio of the first compressed data word and the compression ratio of the second compressed data word.

25. The system of claim 19, further comprising a memory controller that is coupled to a second memory, wherein the compressor resides in between the cache memory and the memory controller.

* * * * *